(12) United States Patent
Gravermann et al.

(10) Patent No.: US 9,460,832 B2
(45) Date of Patent: Oct. 4, 2016

(54) SLEEVE FOR A POWER CABLE

(71) Applicant: 3M INNOVATIVE PROPERTIES COMPANY, St. Paul, MN (US)

(72) Inventors: Mark Gravermann, Neuss (DE); Gerhard Lohmeier, Neuss (DE); Michael Stalder, Neuss (DE); Friedrich Busemann, Neuss (DE); Jens Weichold, Neuss (DE); Bernd Schubert, Neuss (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/765,440

(22) PCT Filed: Jan. 29, 2014

(86) PCT No.: PCT/US2014/013629
§ 371 (c)(1),
(2) Date: Aug. 3, 2015

(87) PCT Pub. No.: WO2014/120792
PCT Pub. Date: Aug. 7, 2014

(65) Prior Publication Data
US 2016/0005511 A1 Jan. 7, 2016

(30) Foreign Application Priority Data

Feb. 1, 2013 (EP) .................................... 13153618

(51) Int. Cl.
*H01B 9/00* (2006.01)
*H01R 9/05* (2006.01)
(Continued)

(52) U.S. Cl.
CPC ................ *H01B 9/00* (2013.01); *G01R 15/16* (2013.01); *H01B 7/0216* (2013.01); *H01B 7/17* (2013.01);
(Continued)

(58) Field of Classification Search
CPC ..... H01B 9/00; H01R 9/0515; H01R 9/0735
See application file for complete search history.

(56) References Cited

U.S. PATENT DOCUMENTS

| 5,051,733 A | 9/1991 | Neuhouser |
| 5,892,430 A | 4/1999 | Wiesman |

(Continued)

FOREIGN PATENT DOCUMENTS

| DE | 3702735 | 8/1988 |
| DE | 4125856 | 9/1992 |

(Continued)

OTHER PUBLICATIONS

EP Search Report for EP Application No. 13153618.7, PCT/US2014/013629, mailed on Jul. 3, 2013, 8pgs.

(Continued)

*Primary Examiner* — Jeremy C Norris
(74) *Attorney, Agent, or Firm* — Gregg H. Rosenblatt

(57) ABSTRACT

Sleeve (1) for a high- or medium-voltage power cable (120) having an inner conductor (130). The sleeve comprises (i) a tubular sleeve body (10) having an electrically conductive or semiconductive first axial electrode section (60), and (ii) a circuit board (30). The sleeve is radially expandable or shrinkable. It can be arranged radially outward of the inner conductor, such hat the first axial electrode section is radially separated from the inner conductor by at least an electrically insulating spacer layer (140). The circuit board is at least partially arranged radially outward of the sleeve body and comprises an electrical contact (100) which is electrically connected with the first axial electrode section.

20 Claims, 8 Drawing Sheets

(51) Int. Cl.
*H02G 15/04* (2006.01)
*H02G 15/18* (2006.01)
*G01R 15/16* (2006.01)
*H01B 7/02* (2006.01)
*H01B 7/17* (2006.01)
*H01B 13/06* (2006.01)
*H01B 13/22* (2006.01)
*H05K 3/30* (2006.01)
*G01R 1/06* (2006.01)

(52) U.S. Cl.
CPC .............. *H01B 13/06* (2013.01); *H01B 13/22* (2013.01); *H01R 9/0515* (2013.01); *H02G 15/04* (2013.01); *H02G 15/18* (2013.01); *H02G 15/1806* (2013.01); *H05K 3/30* (2013.01); *G01R 1/06* (2013.01)

(56) References Cited

U.S. PATENT DOCUMENTS

| | | | |
|---|---|---|---|
| 6,814,588 B1 | 11/2004 | Dunlavy | |
| 7,158,012 B2 | 1/2007 | Wiesman | |
| 7,230,411 B2 | 6/2007 | Mulligan | |
| 2002/0171433 A1 | 11/2002 | Watanabe et al. | |
| 2005/0218905 A1 | 10/2005 | Prunk | |
| 2009/0097214 A1 | 4/2009 | Lee | |

FOREIGN PATENT DOCUMENTS

| | | |
|---|---|---|
| EP | 0172634 | 2/1986 |
| EP | 2508898 | 10/2012 |
| JP | S60-256068 | 12/1985 |
| JP | 2010-112882 | 5/2010 |
| KR | 2008-048916 | 6/2008 |
| KR | 2010-044748 | 4/2010 |
| WO | 2012/130816 A1 | 10/2012 |

OTHER PUBLICATIONS

International Search Report for PCT International Application No. PCT/US2014/013629, mailed on May 19, 2014, 3pgs.
Singapore Search Report for Application No. 11201506036V, dated May 3, 2016, 1pg.

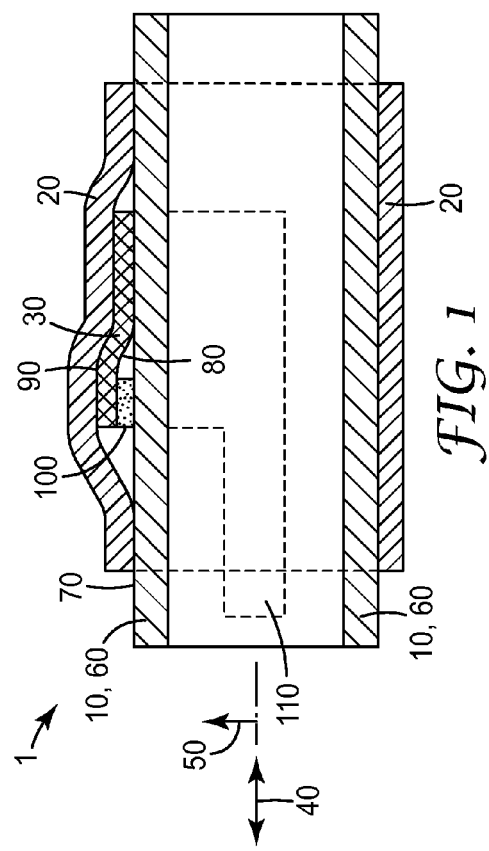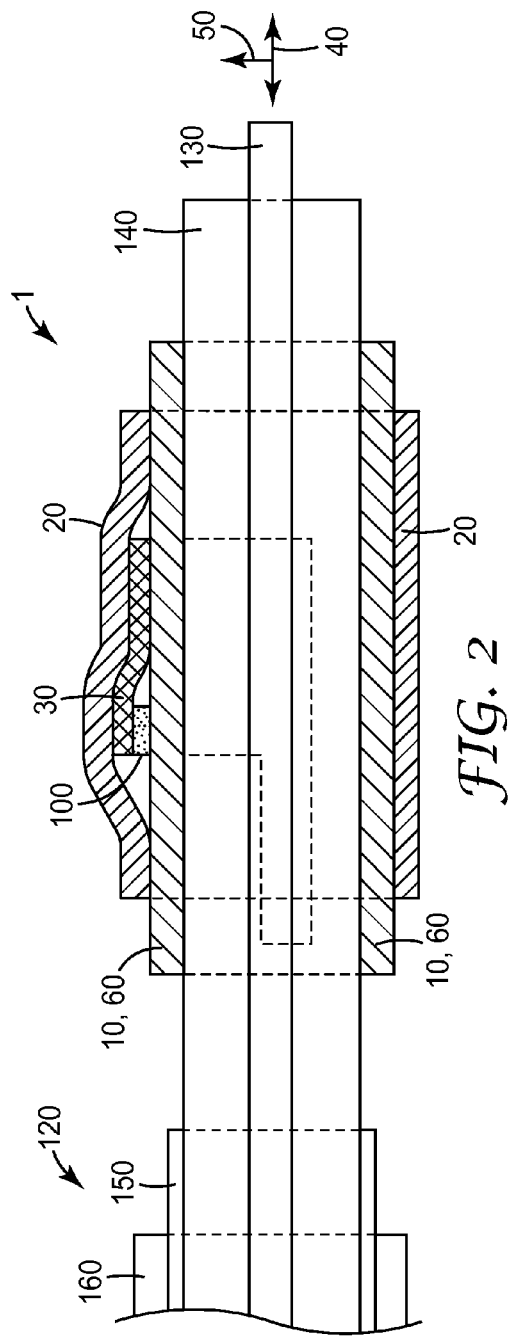

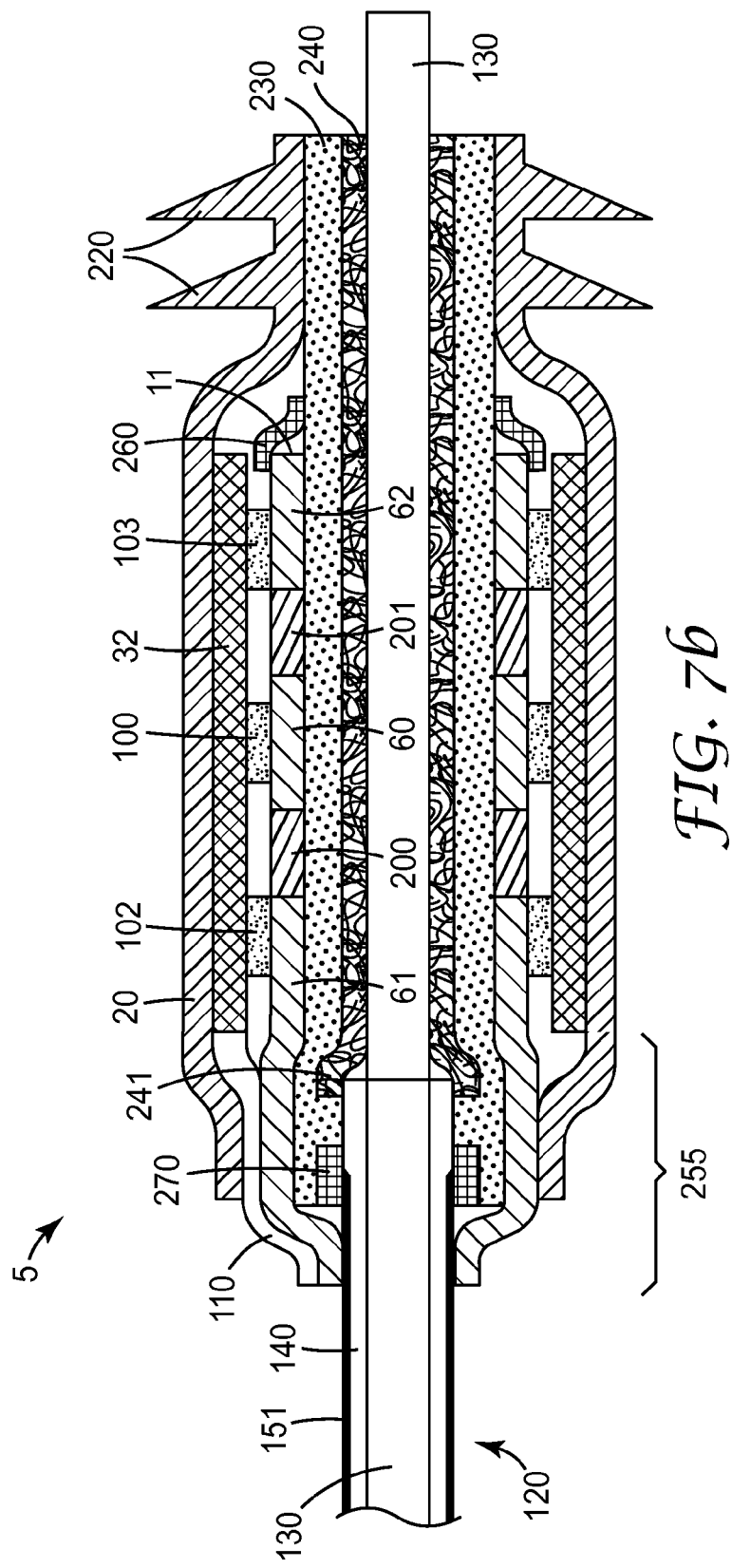

SLEEVE FOR A POWER CABLE

FIELD OF THE INVENTION

The invention relates to sleeves suitable for use on conductors such as those in electrical power cables, to methods for creating such sleeves, to high- or medium-voltage current-carrying devices for power networks, such as power cables, comprising such sleeves, and to power distribution networks comprising current-carrying devices, such as cables, having such sleeves.

BACKGROUND

Operators of electrical power networks monitor the state of their networks using sensors for voltage and current on cables in their networks. Such cables typically have an inner conductor, surrounded by an insulating layer, a shield layer, and an outer cable sheath. Normally, only a few sections of a cable are well accessible. It is therefore desirable that a sensor can be placed in any position along the cable length. Also, the installation of a sensor should be simple and quick, hence cost effective. For that purpose, sensors have been used that are protected by so-called cable splices. A typical cable splice comprises a sleeve that can be applied around a section of the cable. An example of such a sleeve is shown in the Japanese patent document JP60256068 (A), where a conductive or semi-conductive member is partially wound around an outer peripheral surface of the insulator of the cable to form a suspended electrode while a lead wire is embedded in said electrode and connected to it. Thereafter, an insulating member is wound around the outer peripheries of the suspended electrode and the insulator to cover both outer peripheral surfaces thereof. Both terminals of a shielding electrode, wound around the outer peripheral surface of the insulating member by using a semiconductive member, are wound around the outer periphery of the cable shielding layer in an overlapped state to connect both shielding electrodes.

A further, more advanced sleeve is described in the German patent publication DE 3702735 A1. In the device shown in this document, a conductive layer or conductive tape, located around the wire insulation of a high-voltage cable together with a low-voltage capacitor, forms a capacitive voltage divider. The voltage divider can be installed subsequently by a specially shaped connecting sleeve or by specially shaped cable terminations at any point in a cable network.

A voltage sensor for a power cable may require a plurality of electric or electronic components, like, for example, electrodes, wires, capacitors, transistors, resistors, inductors, wire coils, or integrated circuits. These components can be accommodated outside a sleeve, but being exposed outside the sleeve, these components may be damaged, affected by environmental conditions, experience short circuit, or may cause a risk of personal injury by an electrical shock. It would thus be desirable to arrange electric components in a manner that avoids these risks. It is further desirable to arrange the electric components in a mechanically stable and orderly manner, close to each other for facilitating electrical connections between them. The sleeve, that is to protect the cable in the section where a voltage sensor is installed, should furthermore be easy to apply to the cable.

SUMMARY

The present invention addresses these needs. The invention provides, in a first aspect, a sleeve for a high- or medium-voltage power cable, the cable comprising an inner conductor defining axial and radial directions, wherein the sleeve comprises a tubular sleeve body having a first axial electrode section, which section is electrically conductive or semiconductive, characterized in that the sleeve is radially expandable and arrangeable radially outward of the inner conductor when expanded, such that the first axial electrode section is radially separated from the inner conductor by at least an electrically insulating spacer layer, and in that the sleeve further comprises a circuit board, at least partially arranged radially outward of the sleeve body, comprising a first electrical contact which is electrically connected with the first axial electrode section.

In a second aspect, the invention provides a sleeve for a high- or medium-voltage power cable, the cable comprising an inner conductor defining axial and radial directions, wherein the sleeve comprises a tubular sleeve body having a first axial electrode section, which section is electrically conductive or semiconductive, characterized in that the sleeve is radially shrinkable into a position radially outward of the inner conductor when shrunk, such that the first axial electrode section is radially separated from the inner conductor by at least an electrically insulating spacer layer, and in that the sleeve further comprises a circuit board, at least partially arranged radially outward of the sleeve body, comprising a first electrical contact which is electrically connected with the first axial electrode section.

The word "sleeve" implies an arrangement around a cable or elements of a cable. The sleeve according to the disclosure comprises a body and a circuit board. It may further comprise an electrically non-conductive jacket, arranged radially outward of the sleeve body, and at least a part of which is arranged over the circuit board. The circuit board is thereby arranged between the sleeve body and the jacket, i.e. in the sleeve, at least partially. In other words, it is embedded in the sleeve, at least partially. The jacket may protect the circuit board and may help avoiding risks of damage or injury.

Generally, the circuit board can carry a number of electric or electronic components that may be part of a sensor. The circuit board can thus provide a mechanically stable platform for the components and facilitates electrical connections between the components mounted on it. Generally, it is understood that electronic components are a subgroup of electric components. The sleeve is radially expandable or radially shrinkable. It can thus be positioned on the cable at any desired position. An expandable sleeve can be pushed on a cable into a desired position. A shrinkable sleeve can be positioned on a cable in a desired position, and can then be shrunk down on the cable in that position. In both types of sleeves, friction between the sleeve and the cable keeps the sleeve in position.

The sleeve according to the disclosure can be used with medium-voltage or high-voltage power cables. Such cables typically have an inner conductor that carries the power. The inner conductor typically has a circular cross section and extends in the length direction of the cable. The length direction of the inner conductor thereby defines axial directions of the cable and the sleeve, i.e. directions along the cable length. Directions perpendicular to the axial directions are radial directions, i.e. directions pointing away from the center of the circular cross section of the inner conductor. Typically, an electrically insulating layer is arranged around the inner conductor of the cable. The insulating layer is often arranged directly on the inner conductor. Most cables have further layers, arranged radially outward from the insulating layer, e.g. a semiconductive layer, a layer of shielding wires, and a cable sheath as outermost layer. The sleeve according to the invention can be arranged radially outward of the inner conductor such that the first axial electrode section is radially separated from the inner conductor by at least an electrically insulating spacer layer, e.g. by an axial section of the insulating layer which is arranged around the inner conductor. For arranging the sleeve, a cable thus may need to be stripped, i.e. the cable sheath and any outer layers may have to be removed down to the inner conductor, such that the sleeve can be arranged around the inner conductor. In certain embodiments, the sleeve can be arranged directly on the inner conductor. In some of these embodiments, the sleeve comprises the electrically insulating spacer layer.

In certain other embodiments, the sleeve can be arranged directly on the insulating layer of the cable, which is arranged on the inner conductor. In some of these other embodiments, the electrically insulating spacer layer comprises a portion of the insulating layer of the cable. In these other embodiments, the cable may only need to be stripped down to the insulating layer which is arranged on the inner conductor. Generally, the sleeve has a tubular body, hence the sleeve can be pushed over an end of the cable and can then be positioned on the cable.

The sleeve according to the disclosure comprises a tubular sleeve body, a jacket, and a circuit board. The sleeve body may comprise the radially innermost layer of the sleeve. The tubular sleeve body may have one or more axial sections. An axial section of the body is a section of the body extending in an axial direction. The sleeve body has a first axial electrode section. The first axial electrode section is electrically conductive or electrically semiconductive. It may be a tubular section, but may alternatively have a different shape. In certain embodiments, the first axial electrode section extends over a complete circumference, but in other embodiments it may extend over only a part of the complete circumference, without this affecting the first axial electrode section being operable to form an electrode of a sensing capacitor of a voltage sensor for sensing a voltage of the inner conductor of the power cable. The same applies to further axial electrode sections. In the context of the present disclosure, the term "(semi-) conductive" is to express that an element is electrically conductive or electrically semiconductive. The first axial electrode section is radially expandable or radially shrinkable.

In a radially expandable sleeve, such as a push-on sleeve, the first axial electrode section and/or other axial electrode sections may be radially expandable. The first axial electrode section and/or other axial electrode sections may be tubular. In an axial direction, an axial electrode section may have a through-hole, which can accommodate a section of the inner conductor and optionally a section of the insulating layer of the cable. Before expansion, the through-hole may have an inner diameter that is smaller than the outer diameter of the inner conductor or of the insulating layer of the cable, around which the sleeve is to be arranged. The sleeve may be expanded by pushing it over the insulating layer or over the inner conductor at an end of the cable. Generally, this push-on technique of arranging an expandable sleeve over an inner conductor or over an insulating layer of a power cable is known. Often, grease is used to facilitate the pushing of an expandable sleeve over a layer of the cable. Once an expandable sleeve according to this disclosure is pushed over the inner conductor of the cable, the radially innermost layer of the sleeve body may be in direct mechanical contact with the radially outer surface of the inner conductor. Once a different expandable sleeve according to this disclosure is pushed over the insulating layer of the cable, the radially innermost layer of the sleeve body may be in direct mechanical contact with the radially outer surface of the insulating layer. The sleeve body may be radially expandable. The first axial electrode section may comprise an elastic, radially expandable electrically (semi-) conductive silicone. The first axial electrode section may be operable as an electrode of a capacitor. The capacitor may form a part of a capacitive voltage divider, which is comprised in a capacitive voltage sensor for sensing a voltage of the inner conductor.

In a radially shrinkable sleeve, the first axial electrode section and/or other axial electrode sections may be radially shrinkable. The first axial electrode section and/or other axial electrode sections may be tubular. In an axial direction, an axial electrode section may have a through-hole, which can accommodate a section of the inner conductor, and optionally a section of the insulating layer of the cable. The sleeve body may comprise an axially extending through-hole. When the sleeve is in an expanded state, i.e. before shrinking of the sleeve, the through-hole may have an inner diameter that is larger than the outer diameter of the inner conductor or of the insulating layer, around which the sleeve is to be arranged. A shrinkable axial electrode section or an entire shrinkable sleeve body may be held open by a support element, arranged in the through-hole, such that the sleeve body or an axial electrode section can be radially shrunk down upon removal of the support element. The sleeve may be shrunk down after positioning it over the inner conductor or over the insulating layer at an end of the cable. Generally, this technique of shrinking down a heat-shrinkable or a cold-shrinkable sleeve over a layer of a power cable is known. Once a shrinkable sleeve according to this disclosure is shrunk down over the inner conductor of the cable, the radially innermost layer of the sleeve body may be in direct mechanical contact with the radially outer surface of the inner conductor. Once a shrinkable sleeve according to this disclosure is shrunk down over the insulating layer of the cable, the radially innermost layer of the sleeve body may be in direct mechanical contact with the radially outer surface of the insulating layer. The first axial electrode section is electrically (semi-) conductive. The first axial electrode section of a shrinkable sleeve body may comprise an elastic, radially shrinkable, electrically (semi-) conductive silicone. The first axial electrode section may be operable as an electrode of a capacitor. The capacitor may form a part of a capacitive voltage divider, which is comprised in a capacitive voltage sensor for sensing a voltage of the inner conductor.

In at least one embodiment, the sleeve according to the present disclosure further comprises an electrically non-conductive jacket. The jacket may be, at least partially, arranged radially outward of the sleeve body. At least a part of the jacket may be arranged radially outward of the sleeve body and on the sleeve body, i.e. in direct mechanical contact with the sleeve body. Alternatively, at least a part of the jacket may be arranged radially outward of the sleeve body and at a radial distance from the sleeve body, i.e. not in direct mechanical contact with the sleeve body. In this latter case, an intermediate layer or an intermediate element may be arranged between that part of the jacket and the sleeve body. The jacket may be, at least partially, arranged radially outward of the circuit board.

The jacket may be tubular. It may have an inner bore, defining a radially inner surface of the jacket. The inner bore may be adapted to accommodate a section of the sleeve body. It may further be adapted to accommodate an intermediate layer or an intermediate element like, for example, a circuit board, that may be arranged between the jacket and the sleeve body. The jacket may comprise a radially outer surface. The outer surface may support other layers or other elements which are not part of the jacket. It may, for example, support electrically conductive layers or electrically conductive elements.

The non-conductive jacket may be shrinkable, expandable or, in general, elastic. The jacket may thereby shrink or expand, when the sleeve shrinks or expands. This may allow the jacket to form a tight seal and protect elements arranged radially under the jacket before and after shrinking/expanding of the sleeve. The jacket may comprise an elastomer, like, for example, silicone or a synthetic rubber like EPDM (ethylene propylene diene monomer). The jacket may comprise a transparent portion. This may help to visually inspect elements arranged radially inward from the jacket, e.g. the sleeve body or elements arranged between the jacket and the sleeve body.

Generally, a first portion of the jacket may be arranged on a radially outer surface of the circuit board, and a second portion of the jacket may be arranged on a radially outer surface of the sleeve body. The first portion of the jacket may comprise an axial section of the jacket. The second portion of the jacket may comprise another axial section of the jacket. This may allow the jacket to cover and thereby protect the circuit board with the first portion, and at the same time be attached to the sleeve body with the second portion. The jacket may thereby seal the space between the jacket and the sleeve body, so that water and dust cannot enter that space.

In an alternative embodiment, the jacket is not attached to the sleeve body. Instead, it is a separate tubular layer that may be placed over the sleeve body and over the circuit board before or after these are installed on the cable. If the separate jacket is applied after the sleeve body and the circuit board are installed on the cable, the jacket body is preferably a shrinkable jacket that can be held open by a support element having a sufficient diameter to easily fit around the sleeve body and the circuit board. The support element can then be removed to cause the jacket to shrink down over the sleeve body and the circuit board.

In a further alternative embodiment, the jacket comprises extended ends that can extend over and beyond the ends of the sleeve body once the sleeve is installed on the cable. In this manner, the extended ends can be used to cover the exposed portions of the sleeve body, and optionally of a (semi-) conductive layer of the cable. Use of a separate insulating element to do so is then not necessary. In at least one embodiment, the extended ends can be folded back over a central portion of the jacket until the sleeve is fully installed on the cable. Once the sleeve is fully installed on the cable, the extended ends can be pushed or rolled off of the central portion, so that they make physical contact with the outer cable sheath.

The sleeve according to the present disclosure comprises a circuit board, arranged radially outward of the sleeve body. The circuit board may provide a support for electric or electronic components, that can be mounted on the circuit board. It may also provide electrical connections between such components, e.g. by providing conductive traces or conductive paths on one of its surfaces. The circuit board may be a printed circuit board. The circuit board may comprise an electric or electronic component. The electric or electronic component may be operable as a component of a sensor for sensing a voltage or a current or a temperature of the inner conductor of the power cable. The circuit board may comprise at least a capacitor element. The capacitor element may be operable as a secondary capacitor in a capacitive voltage divider, operable for sensing a voltage of the inner conductor of the power cable. This capacitive voltage divider may further comprise a sensing capacitor, the electrodes of which may be the first axial electrode section of the sleeve body and the inner conductor of the power cable. The circuit board may comprise a coil, in particular a Rogowski coil for sensing a current of the inner conductor. The coil may be wound around the circuit board. It may be advantageous to mount components of a voltage sensor or current sensor on the circuit board, because the circuit board may be arranged very close to the inner conductor of the power cable, so that resistive losses in a sensor circuit are reduced. A circuit board also provides an orderly mounting structure for electronic and electric components, which may save space for mounting such components. A circuit board may further provide a mechanically stable and rugged support for electric or electronic components, which may increase the reliability of a circuit comprising these components. Also, the circuit board is at least partially covered by the jacket, so that electric or electronic components mounted on the circuit board may be mechanically protected by the jacket.

The circuit board may have a curved portion. The curved portion may be curved such that the curvature of an inner surface of the curved portion corresponds to a curvature of an outer surface of the sleeve body. This may allow an intimate mechanical contact between the curved portion of the circuit board and the sleeve body. The circuit board may comprise a rigid portion, a flexible portion, or both. A flexible circuit board or a circuit board having a flexible portion may provide for an easier assembly of the sleeve according to the present disclosure.

The jacket is, at least partially, arranged radially outward of the circuit board. The jacket may thereby provide mechanical and/or electrical protection to the circuit board.

The circuit board comprises a first electrical contact, which is electrically connected with the first axial electrode section. The first electrical contact may be in direct mechanical contact with the first axial electrode section. The circuit board may comprise a first major surface and an opposed second major surface. The first electrical contact may be arranged on the first major surface. In that case, electrical or electronic components may be mounted on the second major surface. The first electrical contact may comprise a conductive region, which provides an extended contact area or an extended surface contact area. The conductive region, and in general a conductive region on the circuit board, may be in mechanical and electrical contact with the first axial electrode section. An extended contact area facilitates a reliable electrical contact with other elements, e.g. with the sleeve body. A conductive region may extend over a geometric area of 1 $cm^2$ or more. A conductive region may be arranged on the first major surface of the circuit board. It may comprise, for example, 50%, 75% or 100% of the first major surface.

A conductive region may be in mechanical and electrical contact with the sleeve body in two dimensions and/or over an extended area. A conductive region of the circuit board may form a contact for electrically and mechanically contacting the sleeve body. A conductive region providing an extended contact area is particularly advantageous for establishing intimate mechanical and electrical contact between the first electrical contact and the sleeve body, because it may provide many potential contact points and may maximize the contact area, which results in a more reliable contact and less resistive losses. In embodiments in which the inner electrical resistance of the sleeve body material is not negligible, this arrangement may provide for shorter paths which electrons need to travel through the sleeve body before reaching a contact point of the first electrical contact. This may reduce the effect of the inner resistance of the sleeve body. In general, the fact that the first electrical contact of the circuit board is not a single conductive point, but a conductive region providing an extended contact area, may enhance the accuracy and reliability of a voltage sensor, of which the sleeve body may comprise a capacitor electrode. An extended two-dimensional surface contact area may be larger than the area of a single contact point. It may, for example, have an area of 1 cm$^2$ or more. Because of its extension, it may touch the sleeve body in a great number of contact points. These contact points may be distributed over the extended contact area.

A conductive region of the circuit board may comprise a layer of conductive metal, e.g. gold, silver, or copper. In particular, it may comprise a copper layer. The copper layer may be gold-plated for enhanced electrical contact and/or for protection against environmental influences, e.g. against corrosion.

A conductive region of the circuit board may provide a continuous surface contact area or a patterned, i.e. interrupted, non-continuous, surface contact area. All parts of the patterned surface contact area may be electrically connected with each other. A patterned surface contact area may require less conductive material for manufacturing it, while having only a negligible influence on reliability of the electrical contact and resistive losses. A patterned surface contact area may also enhance the mechanical flexibility of the circuit board, thus reducing the risk of layer cracking when the circuit board is bent, and of flaking. In a specific embodiment, the conductive region comprises a patterned gold-plated copper layer. The pattern of the contact area may, for example, comprise a grid with a square-shaped or a diamond-shaped pattern.

The circuit board may comprise a flexible portion. The conductive region as described above may be arranged on the flexible portion. In particular, the circuit board may comprise a flexible printed circuit board ("PCB"). A flexible portion of the circuit board and in particular a flexible PCB may allow the circuit board to conform better to the sleeve body. This, in turn, may enhance the electrical contact between the circuit board and the sleeve body and thereby may make the contact more reliable, reduce resistive losses, and facilitate higher accuracy of a voltage sensor. A flexible portion of the circuit board may also allow the circuit board to conform to insulating layers of different diameters, so that the same circuit board can be used in sleeves for different cables. In a specific embodiment, the circuit board comprises a flexible double-sided PCB. In general, the circuit board may be a one-sided or a double-sided circuit board.

The circuit board may comprise an extension section which may extend, in an axial direction, further than the jacket, so that a portion of the extension section is externally accessible. An externally accessible portion of the circuit board or of the extension section is a portion that can be accessed from outside of the jacket and/or from outside of the sleeve. An externally accessible portion of an extension section of the circuit board may facilitate connection of wires to the circuit board or may facilitate the connection of external devices to the circuit board. Other portions of the extension section and/or other sections of the circuit board may be arranged radially inward of the jacket, e.g. under the jacket, so that they are mechanically protected by the jacket. Alternatively, the circuit board may have no extension section, but a portion of the circuit board may be externally accessible through an opening in the jacket.

In a sleeve according to the present disclosure, the circuit board is arranged radially outward of the sleeve body. The circuit board may be arranged on the sleeve body. It may be arranged, at least partially, radially outward of the first axial electrode section of the sleeve body. It may be arranged, at least partially, on the first axial electrode section. In a sleeve in which the circuit board is arranged, at least partially, radially outward of the first axial electrode section, but not on the first axial electrode section, an intermediate material may be arranged radially between the first axial electrode section and a portion of the circuit board arranged radially outward of the first axial electrode section. The intermediate material may be a layer of intermediate material. The intermediate material may comprise an electrically conductive material or it may be electrically conductive. The intermediate material may comprise a conformable material. The conformable material may decouple a movement of the first axial electrode section from a movement of the circuit board. Such a conformable material may be conformable at room temperature and/or manually conformable. Such a conformable material may be electrically conductive. The intermediate material may comprise electrically conductive mastic. The intermediate material may be in direct mechanical contact with the circuit board and the first axial electrode section. The intermediate material may be in direct mechanical contact with the first electrical contact of the circuit board and the first axial electrode section. If the intermediate material comprises electrically conductive material or is electrically conductive, it may electrically connect the first axial electrode section with the first electrical contact of the circuit board. An intermediate material may, in general, facilitate mechanical and/or electrical contact between the circuit board and the sleeve body. In particular, an intermediate material may facilitate mechanical and/or electrical contact between the first electrical contact and the first axial electrode section. A conformable intermediate material may help prevent the circuit board from cracking when the sleeve body is expanded or shrunk. An electrically conductive conformable intermediate material, e.g. an electrically conductive mastic, may further provide improved electrical contact between the sleeve body and the circuit board, and in particular between the first axial electrode section of the sleeve body and the first electrical contact of the circuit board.

In a sleeve according to the present disclosure, the jacket is arranged, at least partially, radially outward of the circuit board. The jacket may be arranged on the circuit board. In a sleeve in which the jacket is arranged, at least partially, radially outward of the circuit board, but not on the circuit board, a cover material may be arranged radially between a portion of the circuit board and a portion of the jacket. The cover material may be a layer of cover material. The cover material may comprise an electrically insulating material or it may be electrically insulating. The cover material may comprise a conformable material. Such a conformable material may be conformable at room temperature and/or manually conformable. Such a conformable material may be electrically insulating. The cover material may comprise an electrically insulating tape. The cover material may be in direct mechanical contact with the circuit board and the jacket. If the circuit board has first and second opposed major surfaces, wherein the first major surface is oriented towards the sleeve body or towards the first axial electrode section of the sleeve body, the cover material may be in direct mechanical contact with the second major surface of the circuit board. A cover material may, in general, reduce mechanical friction between the circuit board and the jacket.

A cover material may reduce friction, or provide mechanical slippage, between a radially outer surface of the circuit board and a radially inner surface of the jacket, thereby reducing the risk of the circuit board cracking or otherwise being damaged when the sleeve body is expanded or shrunk.

In an aspect of the disclosure, the first axial electrode section may be operable to form an electrode of a sensing capacitor of a voltage sensor for sensing a voltage of the inner conductor of the power cable. A voltage sensor for sensing a voltage of the inner conductor of the power cable may comprise a capacitive voltage divider comprising a sensing capacitor. The sensing capacitor may comprise a first and a second capacitor electrode. When a sleeve according to the present disclosure is arranged around the insulating layer of a power cable, the first axial electrode section of the sleeve body may be operable as the first electrode of the sensing capacitor, and the inner conductor of the power cable may be operable as the second electrode of the sensing capacitor.

When a sleeve according to the present disclosure is arranged around the inner conductor of a power cable, the first axial electrode section of the sleeve body may be operable as the first electrode of the sensing capacitor, and the inner conductor of the power cable may be operable as the second electrode of the sensing capacitor. The spacer layer, which may be comprised in the sleeve, may be operable as a dielectric of the sensing capacitor.

The spacer layer may be comprised in a sleeve according to the present disclosure. In this case, the spacer layer may be the innermost layer of the sleeve. The sleeve may then be arrangeable directly on the inner conductor of the cable, such that the spacer layer separates the first axial electrode section of the sleeve body from the inner conductor.

Alternatively, the spacer layer may be a layer of the power cable. In this case, the spacer layer may, for example, comprise a portion of an insulating layer which is arranged around the inner conductor of the power cable. In particular, the spacer layer may be the insulating layer of the cable. The sleeve may then be arrangeable directly on the insulating layer, such that the insulating layer separates the first axial electrode section of the sleeve body from the inner conductor. The insulating layer of the cable may be operable as a dielectric of the sensing capacitor.

The sleeve body may comprise a second axial electrode section, which is coaxially aligned with the first axial electrode section, and which is electrically conductive or semiconductive. The first axial electrode section and the second axial electrode section may be separated, in an axial direction, by a first axial separation section which is electrically non-conductive. The first axial electrode section may have a tubular shape, i.e. it may be tubular. The second axial electrode section may be tubular. The first and the second axial electrode sections may have a same inner diameter and/or a same outer diameter. They may be arranged side-by-side with respect to each other, i.e. coaxially aligned and arranged like two axial sections of a tube. The second axial electrode section may be made of the same material as the first axial electrode section. The first axial separation section may be coaxially aligned with the first and/or the second axial electrode section. The first axial separation section may be arranged between and/or adjacent to the first and the second axial electrode section. It may be in direct mechanical contact with the first or with the second axial electrode section, or with both. The second axial electrode section may be operable to mechanically and electrically contact a (semi-) conductive layer arranged on an insulating layer of the power cable, on which the sleeve may be arranged. It may be operable as an electrical stress control means. The second axial electrode section may be arranged in the sleeve such that it is radially separated from the inner conductor of the cable by at least the electrically insulating spacer layer, when the sleeve is arranged on the power cable.

The first axial separation section of the sleeve body is electrically non-conductive and may therefore provide electrical and mechanical separation between the first and the second axial electrode sections. This may allow the first and the second axial electrode sections to be on different electrical voltage levels. This may facilitate the first axial electrode section to be operable as an electrode of a sensing capacitor of a voltage sensor for sensing a voltage of the inner conductor of the power cable, on which the sleeve is arranged.

In certain embodiments of the present disclosure, the circuit board comprises a first and a second major surface and a second electrical contact. The first electrical contact and the second electrical contact may be arranged on the first major surface. The first electrical contact may comprise a first conductive region providing an extended contact area, as described above. The second electrical contact may comprise a second conductive region providing an extended contact area. The second conductive region may have the same properties as were described above for the first conductive region. The first conductive region may be in mechanical and electrical contact with the first axial electrode section, and the second conductive region may be in mechanical and electrical contact with the second axial electrode section. This may allow electric or electronic components mounted on the circuit board to pick up different voltages from the first and from the second axial electrode section and hence to determine a voltage difference between the first and the second axial electrode sections.

A sleeve body, comprising a second axial electrode section and a first axial separation section as described above, may comprise a third axial electrode section, which may be coaxially aligned with the first and the second axial electrode section, and which is electrically conductive or semi-conductive. The second and the third axial electrode sections may electrically cooperate for providing a more homogenous electrical field at the position of the first axial electrode section. The first axial electrode section and the third axial electrode section may be separated, in an axial direction, by a second axial separation section which is electrically non-conductive. The third axial electrode section may be tubular. The first and the third axial electrode sections may have a same inner diameter and/or a same outer diameter. They may be arranged side-by side with respect to each other, i.e. coaxially aligned and arranged like two axial sections of a tube. The third axial electrode section may be made of the same material as the first and/or the second axial electrode section. The second axial separation section may be coaxially aligned with the first and/or the third axial electrode section. The second axial separation section may be arranged between and adjacent to the first and the third axial electrode section. It may be in direct mechanical contact with the first or with the third axial electrode section, or with both. The third axial electrode section may be operable to mechanically and electrically contact a (semi-) conductive layer on an insulating layer of the power cable, on which the sleeve is arranged. It may be operable as an electrical stress control means.

The third axial electrode section may be arranged in the sleeve such that it is radially separated from the inner conductor of the cable by at least the electrically insulating spacer layer, when the sleeve is arranged on the power cable.

The second axial separation section of the sleeve body is electrically non-conductive and may therefore provide electrical and mechanical separation between the first and the third axial electrode section. This may allow the first and the third axial electrode sections to be on different electrical voltage levels. This may facilitate the first axial electrode section to be operable as an electrode of a sensing capacitor of a voltage sensor for sensing a voltage of the inner conductor of the power cable, on which the sleeve is arranged.

In a sleeve in which the sleeve body comprises a first, a second and a third axial electrode section and a first and a second axial separation section, as described above, the circuit board may be operable to provide an electrical contact, or an electrical connection, between the second axial electrode section and the third axial electrode section. This may allow the second and the third axial electrode sections to be held on a same electrical voltage. The circuit board may further be operable to provide an electrical contact, or an electrical connection, between the first axial electrode section and the second axial electrode section. The circuit board may further be operable to provide an electrical contact, or an electrical connection, between the first axial electrode section and the third axial electrode section. This may allow the second and/or the third axial electrode section to be held on a same electrical voltage as the first axial electrode section. The circuit board may further be operable to provide an electrical contact, or an electrical connection, between the first axial electrode section and the second axial electrode section temporarily. The circuit board may further be operable to provide an electrical contact, or an electrical connection, between the first axial electrode section and the third axial electrode section temporarily. This may allow to put the first axial electrode section on the same voltage as the second or third axial electrode section at times, when it is not necessary to determine a voltage difference between the sections, e.g. at times when a voltage sensor is not operated.

The present disclosure also provides a high- or medium-voltage power cable, comprising an inner conductor, and comprising a sleeve as described above in this disclosure, the sleeve being arranged radially outward of the inner conductor, such that the first axial electrode section is radially separated from the inner conductor by at least an electrically insulating spacer layer. The present disclosure also provides an electrical power distribution network, or an electrical power network, comprising such a power cable.

A high- or medium-voltage power cable is one representative of a broader class of high- or medium voltage current carrying devices for power networks. A sleeve according to the present disclosure may be used on other high- or medium voltage current carrying devices for power networks than on power cables. It may, for example, be used on an electrically conductive metal rod, which can carry current in a power network. The rod may be regarded as an inner conductor of a current-carrying device. The rod may be adapted to be connected to respective power cables on its two ends, e.g. by splices or by connectors. A sleeve according to the present disclosure may then be arranged radially outward of the inner conductor, such that the first axial electrode section is radially separated from the inner conductor by at least an electrically insulating spacer layer. The spacer layer may be an insulating layer, arranged around the rod. Alternatively, the spacer layer may be comprised in the sleeve. Generally, and independent from any particular embodiment, the present disclosure provides a high- or medium-voltage current-carrying device for a power network, such as a high- or medium-voltage power cable, comprising an inner conductor for carrying the current, further comprising a sleeve as described above, the sleeve being arranged radially outward of the inner conductor, such that the first axial electrode section is radially separated from the inner conductor by at least an electrically insulating spacer layer. The present disclosure also provides an electrical power distribution network, or an electrical power network, comprising such a high- or medium-voltage current-carrying device.

A traditional expandable sleeve may be upgradeable to a sleeve according to the present disclosure. The present disclosure therefore also provides a method of providing a expandable sleeve according to the present disclosure, as described above. The method comprises, in this sequence, the steps of:

a) providing an expandable sleeve for a high- or medium-voltage power cable, wherein the sleeve comprises a tubular sleeve body having a first axial electrode section, which section is electrically conductive or semiconductive, wherein the sleeve is radially expandable and arrangeable radially outward of an inner conductor of the cable when expanded, such that the first axial electrode section is radially separated from the inner conductor by at least an electrically insulating spacer layer; providing an electrically non-conductive jacket; and providing a circuit board comprising opposed first and second major surfaces and a first electrical contact, arranged on the first major surface;

b) arranging at least a part of the circuit board radially outward of the sleeve body such that the first electrical contact is electrically connected with the first axial electrode section;

c) arranging at least a part of the jacket radially outward of the circuit board and radially outward of the sleeve body.

Similarly, a traditional shrinkable sleeve may be upgradeable to a sleeve according to the present disclosure. The present disclosure therefore also provides a method of providing a shrinkable sleeve according to the present disclosure, as described above. The method comprises, in this sequence, the steps of:

a) providing a shrinkable sleeve for a high- or medium-voltage power cable, wherein the sleeve comprises a tubular sleeve body having a first axial electrode section, which section is electrically conductive or semiconductive, wherein the sleeve is radially shrinkable and arrangeable radially outward of an inner conductor of the cable when shrunk, such that the first axial electrode section is radially separated from the inner conductor by at least an electrically insulating spacer layer, providing an electrically non-conductive jacket, and providing a circuit board comprising opposed first and second major surfaces and a first electrical contact, arranged on the first major surface;

b) arranging at least a part of the circuit board radially outward of the sleeve body such that the first electrical contact is electrically connected with the first axial electrode section;

c) arranging at least a part of the jacket radially outward of the circuit board and radially outward of the sleeve body.

In both methods, an additional step a1 can be introduced before step b. This step a1 is to provide an electrically conductive intermediate material on at least a portion of the first major surface of the circuit board or on at least a portion of the first electrical contact. In both methods, and independent of a step a1, an additional step b1 can be introduced before step c. This step b1 is to provide an electrically insulating cover material on at least a portion of the second major surface.

These methods may allow to provide existing expandable or shrinkable sleeves with additional functionality by adding a circuit board and a jacket to them. In particular, the methods may facilitate the integration of electric or electronic components into a traditional expandable or shrinkable sleeve. In particular, the methods may facilitate the addition or integration of components of voltage sensors or current sensors or temperature sensors into traditional expandable or shrinkable sleeves.

BRIEF DESCRIPTION OF THE DRAWINGS

The invention will now be described in more detail with reference to the following Figures exemplifying particular embodiments of the invention.

FIG. 1 Longitudinal section of a first sleeve according to the present disclosure;

FIG. 2 Longitudinal section of the sleeve of FIG. 1, arranged on an insulating layer of the power cable;

DETAILED DESCRIPTION

Figure 3:
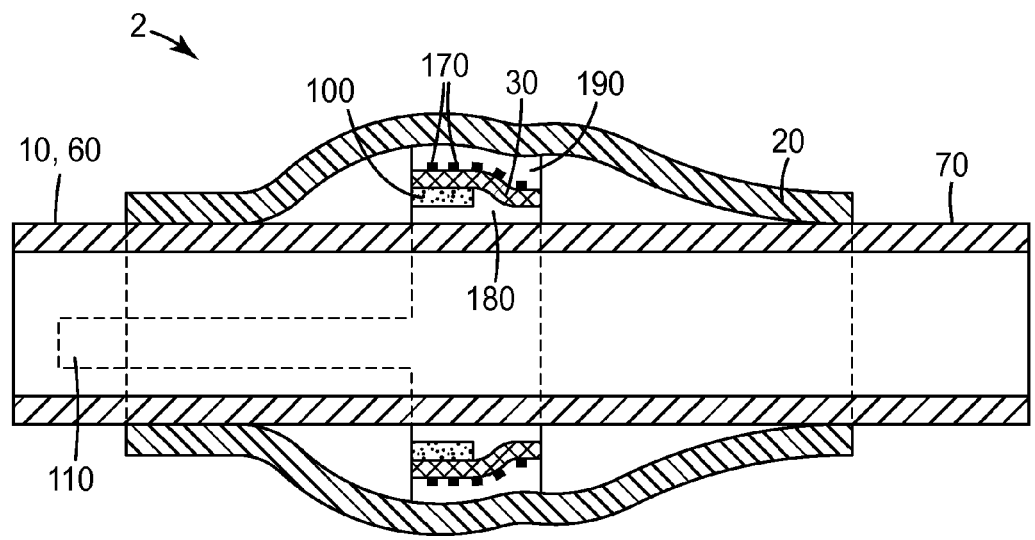
FIG. 3 Longitudinal section of a second sleeve according to the disclosure, with the circuit board embedded.

Herein below various embodiments of the present invention are described and shown in the drawings wherein like elements are provided with the same reference numbers. In the drawings, some elements are not drawn to scale. Some dimensions and some distances have been exaggerated for greater clarity in one or more directions. It is to be understood that other embodiments are contemplated and may be made without departing from the scope of the present invention. The following disclosure, therefore, is not to be taken in a limiting sense.

FIG. 1 is a longitudinal section of a first sleeve 1 according to the present disclosure. The sleeve is a radially expandable sleeve 1 and comprises a tubular sleeve body 10, a jacket 20 and a circuit board 30. The sleeve 1 is for use on a power cable, the length direction of which defines axial directions indicated by arrow 40, and radial directions perpendicular thereto, one of which is indicated by arrow 50. The sleeve body 10 comprises a single axial electrode section 60, generally also called the first axial electrode section 60. The sleeve body 10, i.e. the first axial electrode section 60, is made of an electrically conductive silicone rubber. The sleeve 1 is radially expandable. The inner diameter of the sleeve body 10 is chosen such that when the sleeve 1 is not expanded, its inner diameter is slightly smaller than the outer diameter of a cable insulating layer, arranged around an inner conductor of a power cable, onto which the sleeve 1 is to be pushed. When the sleeve 1 is pushed onto the insulating layer, the sleeve body 10 can be expanded and forms a tight elastic fit around the insulating layer after pushing it on. In this specific embodiment, when not expanded, the sleeve body 10 has an inner diameter of about 25 mm, but the inner diameter of other sleeve bodies 10 may be different, depending on the size of the inner conductor or an insulating spacer layer of the cable. The sleeve body 10 has a cylindrical outer surface 70.

Radially outward of the sleeve body 10, the circuit board 30 is arranged. It is arranged on the sleeve body 10 and conforms to the cylindrical outer surface 70 of the sleeve body 10. It covers about half of the circumference of the sleeve body 10. The circuit board 30 is a flexible printed circuit board ("PCB"). The circuit board 30 has two opposed major surfaces, a radially inner major surface 80 and a radially outer major surface 90. The inner major surface 80 is in mechanical contact with the outer surface 70 of the sleeve body 10. A first electrical contact 100 is arranged on the inner surface 80 of the circuit board 30 and forms a part of that inner surface 80. In other embodiments, it may be separate. It is in mechanical and electrical contact with the outer surface 70 of the sleeve body 10, i.e. with the first axial electrode section 60. The circuit board 30 comprises an extension section 110, which extends in an axial direction 40 far enough beyond the jacket 20 to be not covered by the jacket and hence to be externally accessible. Electrically conductive traces (not shown) on the circuit board 30 lead to the externally accessible portion of the extension section 110, so that wires can be connected to the conductive traces or electrical contacts can be made to the conductive traces. This is useful for picking up electrical signals or electrical voltages or currents from the circuit board 30, or connect electric or electronic devices to the circuit board 30.

The jacket 20 is arranged radially outward of the sleeve body 10 and of the circuit board 30. In an axial center portion of the sleeve body 10, the jacket 20 is arranged circumferentially all around the sleeve body 10, i.e. it there envelopes the sleeve body 10 completely. Where the circuit board 30 is arranged on the sleeve body 10, the jacket 20 contacts the circuit board 30 and is arranged on the circuit board 30. It thereby protects the circuit board 30. The jacket 20 is electrically non-conductive, and does therefore not interfere with conductive traces on the outer surface 90 of the circuit board 30 or with electric or electronic components (not shown) arranged on the outer surface 90 of the circuit board 30. Where the jacket 20 is not arranged on the circuit board 30, it is arranged on the sleeve body 10. In particular, the portions of the jacket 20 close to its axial edges (i.e. the outer right and outer left portions in FIG. 1) are arranged directly on the sleeve body 10. These portions are in intimate contact with the sleeve body 10 and therefore form a seal, which prevents humidity or dust from entering the space under the jacket 20. This helps to avoid corrosion or short-circuits on the circuit board 30. The portions of the jacket 20 which are arranged on the circuit board 30 (i.e. the middle portions in the upper part of FIG. 1) cover the circuit board 30 and thereby provide mechanical protection against abrasion or impact to the circuit board 30. The jacket 20 is made of a transparent expandable silicone.

This facilitates expansion of the jacket 20 with the sleeve body 10 when the sleeve 1 is pushed onto a cable and is thereby expanded. The transparency facilitates visual observation of the circuit board 30 and of any electric or electronic components (not shown) arranged on its outer surface 90. The jacket 20 is arranged over a part of the extension section 110. It is in intimate contact with the upper surface 90 of the extension section 110 of the circuit board 30. The lower surface 80 of the extension section 110 is held in intimate contact with the sleeve body 10 by the jacket 20.

This arrangement provides sealing against dust and humidity also in the area where the extension section 110 protrudes from the jacket 20.

FIG. 2 shows, in longitudinal section, the sleeve 1 of FIG. 1 arranged on an insulating layer 140 of a power cable 120. The Figure is not to scale, and some radial and axial dimensions have been exaggerated for greater clarity. The cable 120 comprises a central inner conductor 130, which has a circular cross section and extends in the length direction of the cable 120. It defines axial directions, indicated by arrow 40, and radial directions, one of which is indicated by arrow 50. The inner conductor 130 is surrounded by an insulating layer 140. The sleeve body 10 of the sleeve 1 is arranged directly on the insulating layer 140. Except where the sleeve 1 is arranged on the cable 120, a semiconductive layer 150 is arranged on the insulating layer 140, and a protective cable sheath 160 is arranged on the semiconductive layer 150. The insulating layer 140, the conductive layer 150 and the cable sheath 160 are arranged concentrically around the inner conductor 130. The sleeve body 10 is operable to form an electrode of a sensing capacitor of a voltage sensor. The inner conductor 130 can form the second electrode of the sensing capacitor, while the insulating layer 140 can form the dielectric of the sensing capacitor. The sensing capacitor can thereby be used to sense a voltage of the inner conductor 130, e.g. versus electrical ground.

The expandable sleeve 1 has been pushed or placed onto the insulating layer 140 of the cable 120 and has thereby been radially expanded. In order to expose the insulating layer 140, the cable 120 has been stripped, i.e. the conductive layer 150 and the cable sheath 160 have been removed. The sleeve body 10 is elastic: Once pushed or placed onto the insulating layer 140, the sleeve body 10 tries to regain its original, unexpanded diameter, and thereby forms a tight fit between the sleeve body 10 and the insulating layer 140.

FIG. 3 is a longitudinal section of an alternative expandable sleeve 2 according to the present disclosure. The Figure is not to scale, and some radial and axial dimensions have been exaggerated for greater clarity. The alternative sleeve 2 is similar to the sleeve 1 of FIGS. 1 and 2 in that it comprises a tubular, radially expandable sleeve body 10, which has one single axial electrode section 60, a jacket 20, and a circuit board 30 having a first electrical contact 100. The circuit board 30 is arranged circumferentially around the sleeve body 10. Unlike in FIGS. 1 and 2, electric components 170 are shown, which are arranged on the circuit board 30. In contrast to the sleeve 1 of FIGS. 1 and 2, the circuit board 30 extends along more than half of the circumference of the sleeve body 10.

A layer of electrically conductive mastic 180 is arranged between the inner major surface 80 of the circuit board 30 and the outer surface 70 of the sleeve body 10. The mastic 180 acts as an intermediate material. It is conformable and may thus, alternatively, be arranged in other shapes than in a layer. It is coextensive with the circuit board 30. The mastic layer 180 is conformable and soft at room temperature. While maintaining the electrical contact between the first electrical contact 100 and the sleeve body 10, it permits the circuit board 30 to flow on the outer surface 70 of the sleeve body 10. The mastic layer 180 decouples a small movement of the sleeve body 10 from a movement of the circuit board 30. When the sleeve 2 is expanded, the circuit board 30 can be displaced to some extent on the outer surface 70 of the sleeve body 10, and thereby compensate for the larger diameter and circumference of the sleeve body 10 after expansion. This helps to reduce mechanical load on the circuit board 30 during and after expansion of the sleeve body 10, and avoids damage to the circuit board 30 when the sleeve 2 is radially expanded.

The sleeve 2 shown in FIG. 3 further comprises a layer of silicone 190. The silicone 190 acts as a non-conductive cover material. It is conformable and may thus, alternatively, be arranged in other shapes than in a layer. The silicone layer 190 is applied radially outward of the circuit board 30, and it is applied directly on the outer major surface 90 of the circuit board 30 and on the electric components 170, so that it is arranged between the circuit board 30 and the jacket 20. The silicone layer 190 is electrically non-conductive, so that it insulates the electric components 170. The silicone layer 190 is formed by a self-adhesive silicone tape. The silicone layer is soft at room temperature, so that it conforms to the outer surface 90 of the circuit board 30 and any features protruding from that outer surface 90, like the electric components 170. The radially outer surface of the silicone layer 190 is smooth. Due to the softness of the silicone layer 190 and its smooth outer surface, the silicone layer 190 can flow with respect to the radially inner surface of the jacket 20. In order to ensure or enhance this flowing, a separating layer can additionally be provided on the outer surface of the silicone layer. The silicone layer 190 thereby decouples a small movement of the jacket 20 from a movement of the circuit board 30. When the sleeve 2 is expanded, the jacket 20 expands with it. Due to the silicone layer 190, the circuit board 30 can be displaced relative to the inner surface of the jacket 20, and thereby compensate for the larger diameter and circumference of the jacket 20. This helps to reduce mechanical load on the circuit board 30 during and after expansion of the sleeve 2, and avoids damage to the circuit board 30 when the sleeve 2 is radially expanded. Instead of a silicone layer 190, a layer of non-conductive mastic can be used. As a further alternative to silicone tape, the silicone layer 190 may be formed by casting a liquid, non-conductive silicone over the outer surface 90 of the circuit board 30, and letting the silicone solidify. A separating layer can be provided by a mould release agent on the outer surface of the solidified silicone. Liquid silicone is advantageous in that it fills gaps between the electric components 170, which in turn enhances stability.

In the embodiment of the expandable sleeve 2 shown in FIG. 3, the circuit board 30 is embedded or "sandwiched" between two conformable and soft layers, namely the mastic layer 180 and the silicone layer 190. This embedding allows certain circuit boards 30, in particular larger circuit boards 30, to be embedded in an expandable sleeve 2 and reduces the risk of damage to the circuit board 30 during and after expansion of the sleeve 2. A specific circuit board 30, not shown in FIG. 3, may comprise an electric component 170 that is a coil, e.g. a Rogowski coil, suitably oriented for picking up a magnetic field of an electric current in the inner conductor 130. The coil may be arranged on one surface of the circuit board 30, or it may be wound around the circuit board 30. This specific circuit board 30 may be embedded or "sandwiched" between two conformable and soft layers, e.g. a mastic layer 180 and a silicone layer 190, such that the coil is embedded, together with the circuit board 30, between the two conformable and soft layers.

Figure 4:
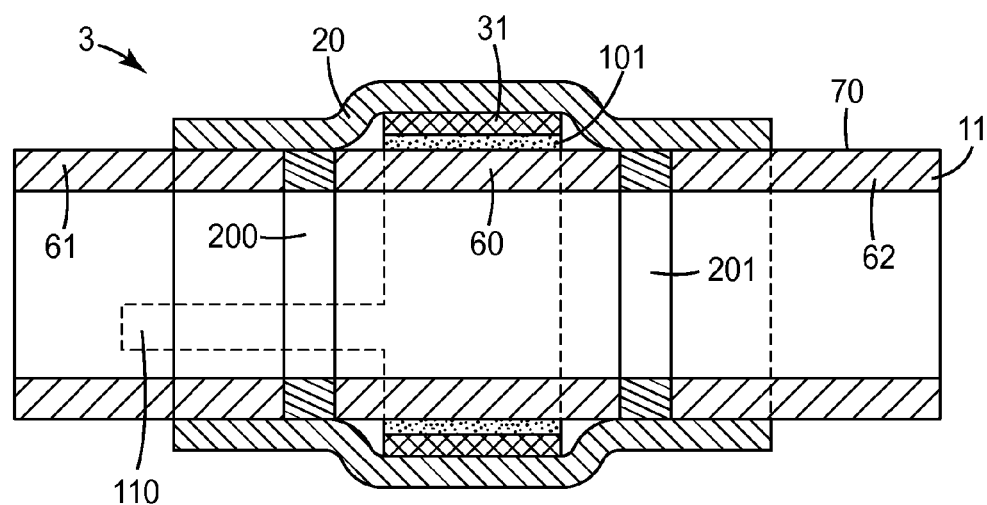
FIG. 4 Longitudinal section of a third sleeve according to the disclosure, comprising three axial electrode sections.

While the sleeve bodies 10 of the sleeves 1, 2 shown in FIGS. 1, 2 and 3 have a single axial electrode section 60, an alternative expandable sleeve 3, shown in FIG. 4, comprises a radially expandable sleeve body 11 having three axial electrode sections, namely a first axial electrode section 60, a second axial electrode section 61, and a third axial electrode section 62. These axial electrode sections 60, 61, 62 are electrically conductive. The second axial electrode section 61 and the third axial electrode section 62 cooperate electrically to shape the electric field such that it is more homogenous in the position of the first axial electrode section 60, where a voltage of the inner conductor 130 of the cable 120 is sensed. This increases the precision of the voltage measurement. The axial electrode sections 60, 61, 62 are made of an electrically conductive silicone rubber. They are separated by a first axial separation section 200 and second axial separation section 201, respectively. The separation sections 200, 201 are electrically non-conductive. The axial electrode sections 60, 61, 62 and the axial separation sections 200, 201 are radially expandable. The inner diameters of the axial electrode sections 60, 61, 62 and of the axial separation sections 200, 201 are identical and chosen such that when the sleeve 3 is not expanded, their inner diameters are slightly smaller than the outer diameter of an insulating layer, arranged around an inner conductor of a power cable, onto which the sleeve 3 is to be pushed or placed. When the sleeve 3 is pushed or placed onto the insulating layer, the sleeve body 10 can be expanded and forms a tight elastic fit around the insulating layer after pushing it on. The sleeve body 10 has a cylindrical outer surface 70. A circuit board 31 with its first electrical contact 101 is arranged on the first axial electrode section 60. It extends circumferentially around more than half of the circumference of the first axial electrode section 60. The circuit board 31 is identical to the circuit board 30 shown in FIGS. 1 to 3, except that its first electrical contact 101 covers the entire inner major surface 80 of the circuit board 31. The contact 101 comprises a conductive region which provides an extended surface contact area. This results in a more reliable electrical contact between the first axial electrode section 60 and the first electrical contact 101. Electric components are arranged on the outer major surface of the circuit board 31, but they are not shown in FIG. 4. The jacket 20 is similar to the jacket 20 shown in FIGS. 1 to 3. It covers the circuit board 31 and extends axially far enough to cover the axial separation sections 200, 201 and portions of the second and third axial electrode sections 61, 62, respectively.

Figure 5:
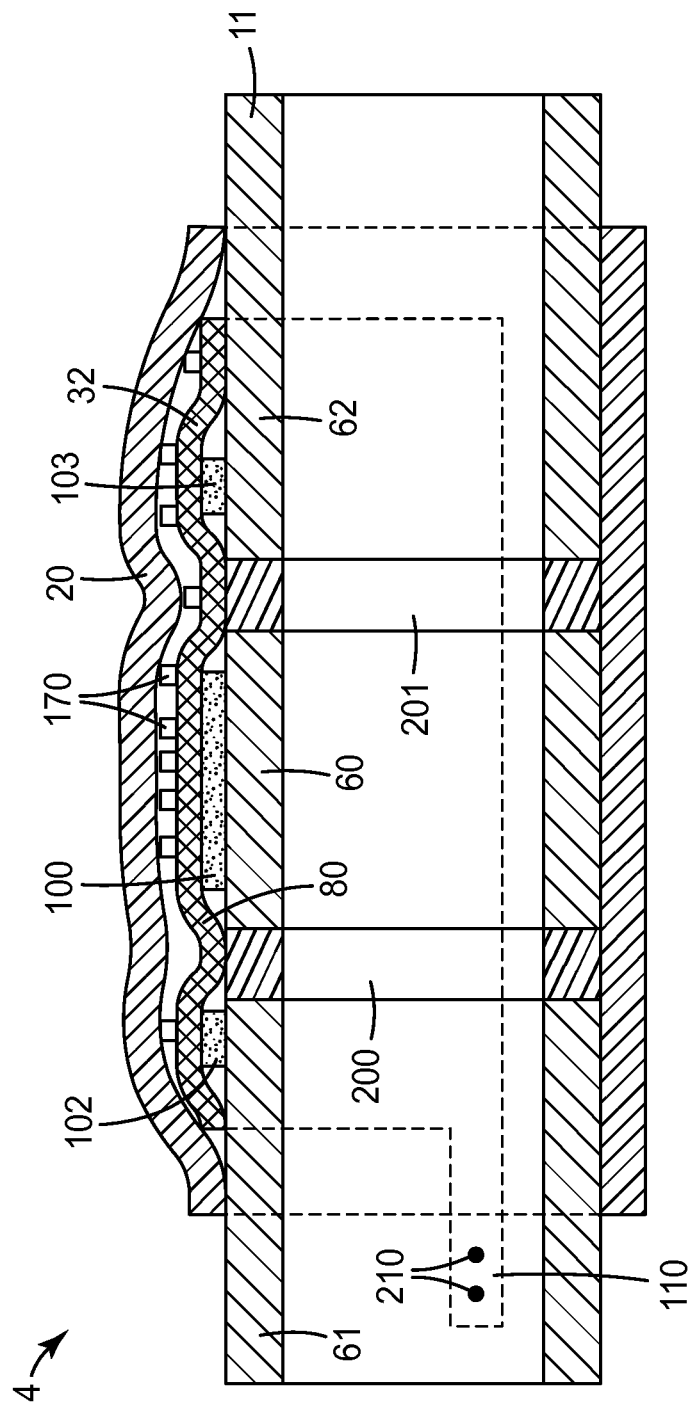
FIG. 5 Longitudinal section of a fourth sleeve according to the disclosure, comprising three electrode sections and a circuit board with three electrical contacts.

FIG. 5 is a longitudinal section of a yet alternative sleeve 4 according to the present disclosure. The Figure is not to scale, and some radial and axial dimensions have been exaggerated for greater clarity. The sleeve body 11 comprises three axial electrode sections 60, 61, 62, and two axial separation sections 200, 201, identical to the axial electrode sections and axial separation sections explained in the context of FIG. 4. In the sleeve 4 of FIG. 5, however, the circuit board 32 extends axially such that it is arranged radially outward of the first axial electrode section 60, and of the second and third axial electrode sections 61, 62. Further to the first electrical contact 100, the circuit board 32 comprises a second electrical contact 102 and a third electrical contact 103. The first, the second and the third electrical contacts 100, 102, 103 are arranged on the inner major surface 80 of the circuit board 32.

The first electrical contact 100 is electrically connected with the first axial electrode section 60 and is arranged directly on the first axial electrode section 60. The second electrical contact 102 is electrically connected with the second axial electrode section 61 and is arranged directly on the second axial electrode section 61. Similarly, the third electrical contact 103 is electrically connected with the third axial electrode section 62 and is arranged directly on the third axial electrode section 62.

Figure 6:
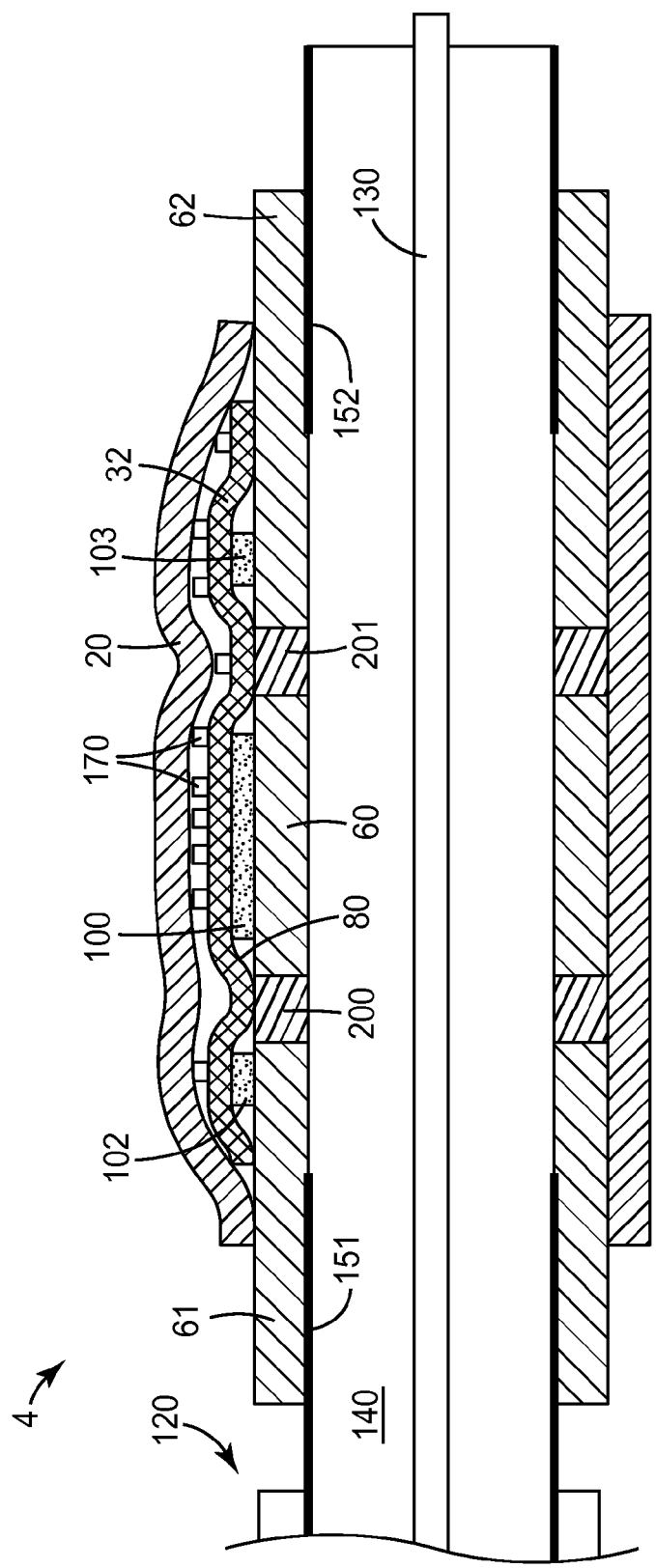
FIG. 6 Longitudinal section of the sleeve of FIG. 5, arranged on a power cable.

The first axial electrode section 60 can be operated as a first electrode of a sensing capacitor for sensing a voltage of an inner conductor 130 of a power cable 120, on which the sleeve 4 is arranged. As described above, the inner conductor 130 of the cable 120 can be used as the second electrode of the sensing capacitor, and the insulating layer 140 can be used as the dielectric of the sensing capacitor. The first electrical contact 100 can thus pick up a voltage of the first electrode, i.e. of the first axial electrode section 60. The second and/or the third electrical contacts 102, 103 can pick up voltages of the second and third axial electrode sections 61, 62, which can be arranged on portions 151, 152 of a conductive layer of the cable 120, as shown in FIG. 6. These two or three voltages are thereby available on the circuit board 32. They can be processed on the circuit board 32 and a result of the processing can be made available externally, i.e. on the outside of the sleeve 4, through electrical interface contacts 210 on the extension section 110 of the circuit board 32. Alternatively, the voltages themselves can be made available externally through the interface contacts 210 on the extension section 110. The interface contacts 210 are electrically connected with electric or electronic components 170 or conductive traces (not shown) on the circuit board 32.

Like in the sleeve shown in FIG. 4, the jacket 20 extends axially from the second axial electrode section 61 over the first axial electrode section 60 to the third axial electrode section 62. It envelopes the full circumference of the electrode sections 60, 61, 62. The jacket 20 covers the circuit board 32 completely.

As is shown in a further longitudinal section in FIG. 6, the sleeve 4 of FIG. 5 can be arranged such that a portion of it is arranged on an insulating layer 140 of a power cable 120 and that the second axial electrode section 61 is arranged directly on a first portion 151 of the conductive layer of the cable 120, and such that the third axial electrode section 62 is arranged directly on a second portion 152, electrically insulated from the first portion 151 of the conductive layer. The second and the third axial electrode sections 61, 62 can thereby be in electrical contact with these portions 151, 152 of the conductive layer. An electrical connection between the second axial electrode section 61 and the third axial electrode section 62 can be established by electrically connecting the second electrical contact 102 with the third electrical contact 103 on the circuit board 32. This connection can be established, for example, by a conductive trace on the circuit board 32. The connection may be switchable, e.g. by a transistor on the circuit board 32, such that at a first time an electrical connection between the second and the third electrical contacts 102, 103 exists, while at a second time, no such connection exists. The first portion 151 of the conductive layer of the cable 120 can thus be brought in electrical connection with the second portion 152 of the conductive layer of the cable 120 via the second axial electrode section 61, the second electrical contact 102, an electrical connection on the circuit board 32 between the second electrical contact 102 and the third electrical contact 103, the third electrical contact 103 and the third axial electrode section 62. Electrically connecting the two portions 151, 152 of the conductive layer of the cable 120 can be useful for electrical stress control.

In the sleeves 1, 3, 4 shown in FIGS. 1, 2, 4 and 5, a conductive intermediate material, e.g. a mastic layer, may be arranged between the circuit board 30, 31, 32 and the axial electrode sections 60, 61, 62. Independent of a conductive intermediate material being present or not, in the sleeves 1, 3, 4 shown in FIGS. 1, 2, 4 and 5, a non-conductive covering material, e.g. a silicone layer, may be arranged between the circuit board 30, 31, 32 and the jacket 20.

Figure 7A:
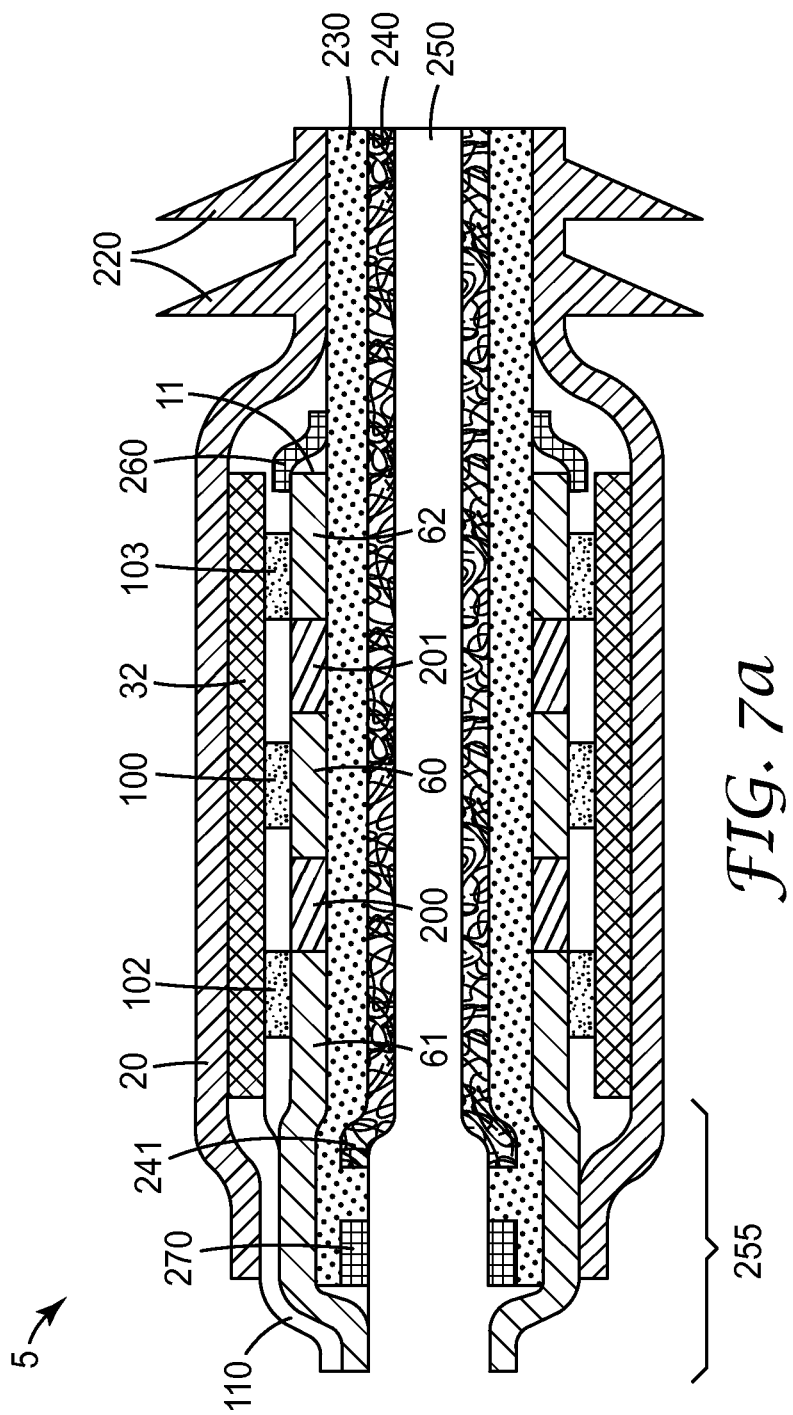
FIG. 7a,b Longitudinal section of a fifth sleeve according to the disclosure, comprising core layers, before and after arrangement on a power cable.

In at least one embodiment, a sleeve according to the disclosure can be arranged on an inner conductor at or near the end of a suitably stripped power cable. Such a sleeve is shown in simplified cross section in FIGS. 7a and 7b. The Figures are not to scale, and some dimensions are exaggerated for clarity. FIG. 7a shows the sleeve 5 alone, while FIG. 7b shows the sleeve 5 arranged on an end portion of a power cable 120. This sleeve 5 is radially expandable and it comprises a sleeve body 11 having first, second and third axial electrode sections 60, 61, 62, separated by first and second separation sections 200, 201. The circuit board 32 has first, second and third electrical contacts 100, 102, 103. The sleeve 5 of FIG. 7a can be arranged directly on an inner conductor of a power cable. An end portion 255 of the sleeve 5 is suitable to accommodate also an insulating layer 140 and a portion 151 of a (semi-) conductive layer 150 of the cable, as is shown in FIG. 7b. The sleeve 5 comprises a jacket 20 which has two umbrella-shaped skirts 220 for suppressing surface leakage. Certain alternative sleeves may have no such skirts 220, one skirt 220 or more than two skirts 220. In the sleeve 5 shown in FIG. 7a, the sleeve body 11 is not an innermost layer of the sleeve 5. The sleeve 5 comprises an insulating core layer 230 and an electrically conductive core layer 240. The insulating core layer 230 and the electrically conductive core layer 240 are radially expandable. They are arranged radially inward of the sleeve body 11. The conductive core layer 240 provides physical and electrical contact to the inner conductor 130 of a power cable 120 on which the sleeve 5 can be arranged. The insulating core layer 230 forms a spacer layer, which separates, in a radial direction, the first axial electrode section 60 and the second and third axial electrode sections 61, 62 from the inner conductor 130, when the sleeve 5 is arranged on the cable 120. The conductive core layer 240 has an annular cross section. The insulating core layer 230 of the sleeve 5 also has an annular cross section and is arranged directly on the conductive core layer 240. The sleeve body 11, in turn, is arranged directly on the insulating core layer 230. The conductive core layer 240 forms an axial bore 250, extending through the sleeve 5, which can accommodate the inner conductor 130. The inner diameter of the bore 250 is chosen such that, in a relaxed, non-expanded state, it is slightly smaller than the outer diameter of the inner conductor 130, on which the expandable sleeve 5 is to be arranged. The sleeve 5 can thereby be pushed onto the inner conductor 130 at an end of the power cable 120. When the sleeve is pushed on, it thereby expands radially slightly so that the conductive core layer 240 forms a tight fit around the inner conductor 130 of the cable, and the insulating core layer 230 forms a tight fit around the insulating layer 140 of the cable in the end portion 255 of the sleeve 5, and such that the second axial electrode section 61 forms a tight fit around the portion 151 of the (semi-) conductive layer 150 of the cable in the end portion 255 of the sleeve 5. When the sleeve 5 is pushed on the inner conductor 130, the conductive core layer 240 and the insulating core layer 230 are expanded, too. The sleeve 5 is then held in position on the cable by friction. The sleeve 5 is shaped to be pushed from the cable end (right side in FIG. 7a) onto the inner conductor 130 up to a position, in which the end portion 241 of the conductive core layer 240 overlaps over a short distance with the end of the insulating layer 140 of the cable. This position is shown in FIG. 7b. In the end portion 255 of the sleeve 5, the inner diameter of the bore 250 is larger, so that it can accommodate the insulating layer 140 and a portion 151 of the (semi-)conductive layer 150 on the insulating layer 140 of the cable. Alternatively, the inner diameter of the bore 250 in the end portion 255 may be the same as in the other axial portions of the sleeve 5. In this case, the sleeve 5 may require more force to push its end portion 255 over the insulating layer 140 of the cable 120. Tapering the edge of the insulating layer 140 and/or using grease may help avoid the need for excessive push-on forces.

When the sleeve 5 is arranged on an inner conductor 130 of a cable 120, the inner conductor 130 and the conductive core layer 240 can be used as a first electrode of a sensing capacitor, the first axial electrode section 60 can be used as a second electrode, and the insulating core layer 230 can be used as a dielectric of the sensing capacitor. The thickness and the electrical properties of the insulating core layer 230 can be determined precisely when manufacturing the sleeve 5. Precise knowledge of these parameters is helpful in sensing the voltage of the inner conductor 130 with a greater precision. The sensing capacitor formed by the electrodes and the dielectric can be electrically connected with a second capacitor to form a capacitive voltage divider, which can sense the voltage of the inner conductor 130. The second capacitor may, for example, be one of the electrical elements 170 (not shown in FIG. 7a) arranged on the circuit board 32. The voltage of the inner conductor 130 versus ground can be sensed, if, for example, the second or third axial electrode section 61, 62 or both are electrically connected to ground. The second axial electrode section 61 and the third axial electrode section 62 can be electrically connected with each other via one or more electrical components 170 on the circuit board 32. This electrical connection is switchable, such that at one time such a connection exists, while at a later time, no such connection exists.

The circuit board 32 comprises a tongue-shaped extension section 110 which extends, in an axial direction, further than the jacket 20. The extension section 110 occupies a small portion of the circumference of the insulating core layer 230 on which it is arranged. A portion of the extension section 110 is externally accessible, so that a voltage, a current, or a signal, available on the circuit board 32, are made available externally of the sleeve 5 through contacts on the extension section 110.

The sleeve 5 of FIG. 7a comprises a first electrical stress control element 260, arranged over a portion of the third axial electrode section 62 and a portion of the insulating core layer 230. In alternative embodiments, this first electrical stress control element 260 is not required. The first stress control element 260 is electrically semiconductive for providing refractive stress control and thereby to avoid excess of electrical stress between the third axial electrode section 62 and the electrically conductive core layer 240, when the sleeve 5 is arranged over the inner conductor 130 of a cable.

A second semiconductive electrical stress control element 270 is arranged in the sleeve 5 such that it can physically and electrically contact a portion 151 of a (semi-) conductive layer 150 on the insulating layer 140 of the cable 120, when the sleeve 5 is positioned on an end of the cable, and the conductive core layer 240 contacts the inner conductor 130 of the cable. Also the second stress control element 270 provides refractive stress control so as to avoid excess electrical stress between the inner conductor 130 of the cable and outer (semi-) conductive layer 151 of the cable, which is normally put on ground potential. The insulating core layer 230 of the sleeve 5 extends axially far enough to cover the second stress control element 270. In a location between the end of the conductive core layer 240 and the second stress control element 270, the insulating core layer 230 is in mechanical and electrical contact with the insulating layer 140 of the cable, when the sleeve 5 is arranged over the end of the cable, as shown in FIG. 7b.

In the sleeve 5 of FIG. 7a, the second axial electrode section 61 is put on electrical ground. This is achieved by the second axial electrode section 61 extending axially beyond insulating core layer 230 towards the left (in FIG. 7a). At the cable side (i.e. the left side in the Figure) end of the sleeve 5, the second axial electrode section 61 is the innermost layer of the sleeve 5.

It can thereby contact electrically and mechanically the portion 151 of the (semi-) conductive layer 150 on the insulating layer 140 of the cable, once the sleeve 5 is pushed over the end of the cable, while the conductive core layer 240 contacts the inner conductor 130 of the cable. The (semi-) conductive layer 150 of the cable and its portion 151 is normally put on electrical ground.

The sleeve 5 can be used as part of a cable termination for an end of a power cable 120. The sleeve 5 of FIG. 7a is an expandable sleeve. The same sequence of layers shown in FIG. 7a can be used to provide a shrinkable sleeve. In a shrinkable sleeve, the conductive core layer 240, the insulating core layer 230, the sleeve body 11 and the jacket 20 are elastic and shrinkable. In a cold-shrink type shrinkable sleeve, an expansion element would be arranged in the bore 250 to hold the sleeve in an expanded state before the sleeve is pushed or placed over the inner conductor 130 of a cable 120. Once the expanded sleeve has been positioned over the inner conductor 130 of the cable 120, the expansion element can be removed, whereby the sleeve is shrunk over the inner conductor 130 and the insulating layer 140 such that the conductive core layer 240 is in a tight mechanical contact with the inner conductor 130.

Figure 8A:
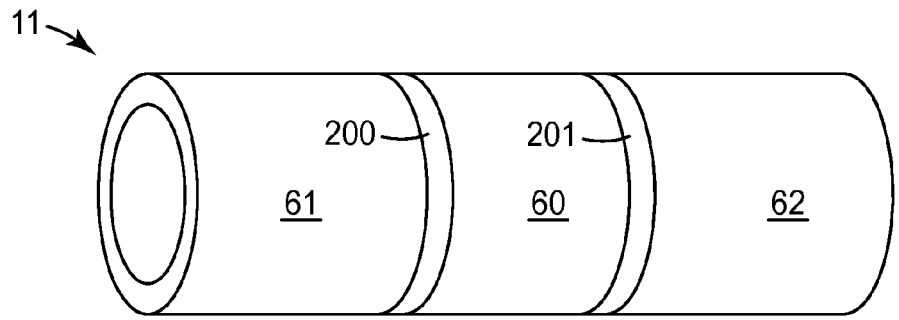
FIG. 8a-c Schematic of an assembly process of a sleeve according to the disclosure.
Figure 8B:
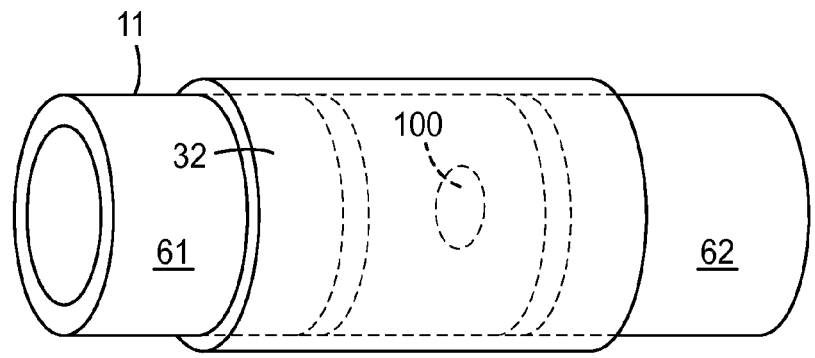
Figure 8C:
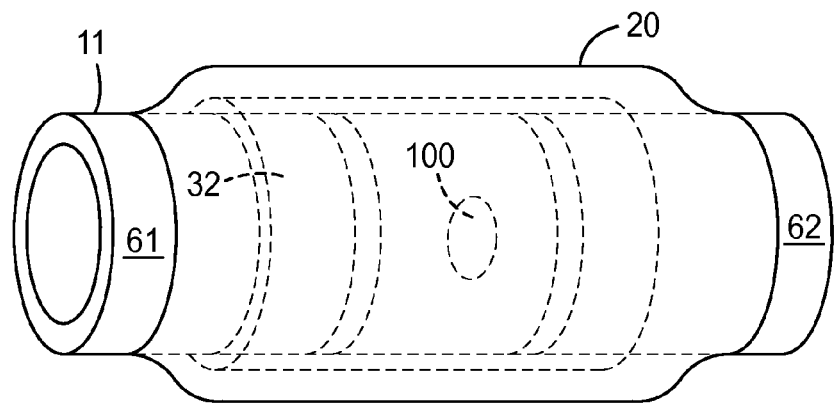

FIGS. 8a-c are illustrations of stages of a process to make a sleeve according to the present disclosure. Firstly, as shown in FIG. 8a, a tubular sleeve body 11 is provided. The sleeve body 11 can be radially expandable or radially shrinkable. A radially shrinkable sleeve body 11 may be held in an expanded state by a cylindrical hollow plastic body inside the sleeve body 11, that can be pulled out axially when the sleeve body 11 is to be shrunk. Alternatively, a radially shrinkable sleeve body 11 may be, for example, a heat-shrinkable sleeve. A radially expandable sleeve body 11 may, for example, comprise an elastic silicone rubber body. In the embodiment shown in FIGS. 8a-c, the sleeve body 11 comprises an electrically conductive first axial electrode section 60, an electrically conductive second axial electrode section 61 and an electrically conductive third axial electrode section 62. The axial electrode sections 60, 61, 62, are separated by electrically non-conductive separation sections 200, 201. Also, an electrically non-conductive jacket 20 and a circuit board 32 having a first electrical contact 100 are provided. In a second step, shown in FIG. 8b, the circuit board 32 is arranged radially outward of the sleeve body 11, such that the first electrical contact 100 is electrically connected with the first axial electrode section 60. In the embodiment shown, the first electrical contact 100 is arranged on the radially inner major surface 80 of the circuit board 32 and is arranged directly on the first axial electrode section 60. In a third step, shown in FIG. 8c, the jacket 20 is arranged radially outward of the circuit board 32. The jacket 20 may, for example, be arranged by moulding a curable, liquid, non-conductive silicone over the circuit board 32 and let the silicone cure and solidify, so that it forms the jacket 20.

Figure 9:
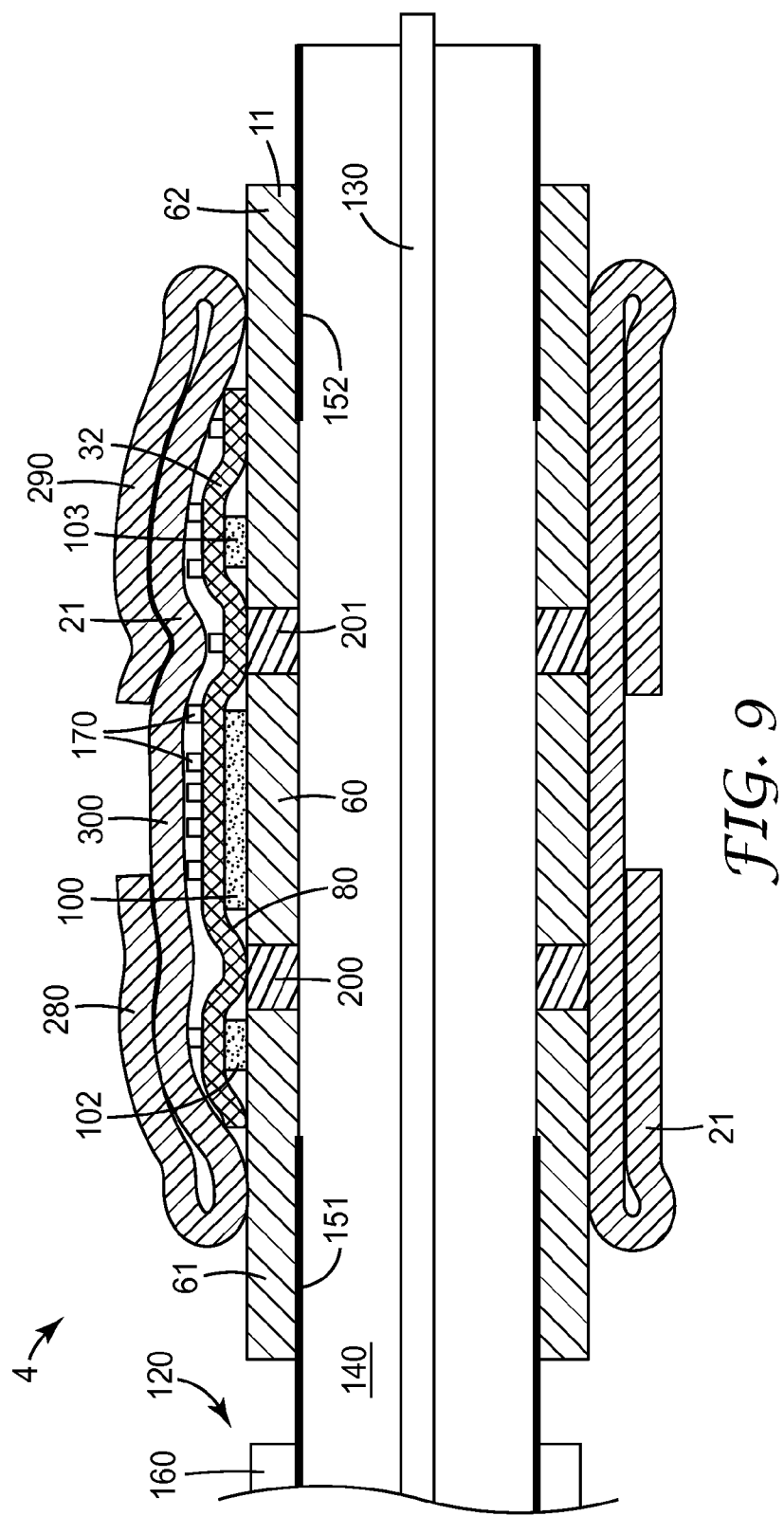
FIG. 9 Longitudinal section of a further sleeve according to the disclosure, arranged on a cable, and comprising an alternative jacket, the end portions of which are folded back over a central portion.

FIG. 9 is a longitudinal section of a sleeve 4, identical to the sleeve 4 of FIG. 6, except for the jacket 21. The jacket 21 is longer, in an axial direction, than the jacket 20 of the sleeve of FIG. 6, and its end portions 280, 290 are folded back over a center portion 300 of the jacket 21. The center portion 300 covers the circuit board 32. Once the sleeve 4 is installed over a cable 120, the end portions 280, 290 can be pushed or rolled off of the center portion 300. The jacket 21 then extends, in axial directions, beyond the ends of the sleeve body 11, and thereby covers the exposed portions of the sleeve body 11 and some of the exposed portions of the portions 151, 152 of the conductive layer of the cable 120. The left (in the Figure) end portion 280, folded back on the cable side of the sleeve 4, is long enough to make physical contact with the outer cable sheath 160 of the cable 120 after being pushed or rolled off of the center portion 300.

The following claims include potential embodiments of a sleeve according to the disclosure.

The invention claimed is:

1. Sleeve for a high- or medium-voltage power cable, the cable comprising an inner conductor defining axial and radial directions,
   wherein the sleeve comprises
      a tubular sleeve body having a first axial electrode section, which section is electrically conductive or semiconductive,
   wherein the sleeve is radially expandable and arrangeable radially outward of the inner conductor when expanded, such that the first axial electrode section is radially separated from the inner conductor by at least an electrically insulating spacer layer,
   and the sleeve further comprises a circuit board, at least partially arranged radially outward of the sleeve body, comprising a first electrical contact which is electrically connected with the first axial electrode section.

2. Sleeve according to claim 1, further comprising an electrically non-conductive jacket, at least partially arranged radially outward of the sleeve body, and at least partially arranged radially outward of the circuit board.

3. Sleeve according to claim 1, wherein the first axial electrode section is operable to form an electrode of a sensing capacitor of a voltage sensor for sensing a voltage of the inner conductor of the power cable.

4. Sleeve according to claim 1, wherein the circuit board comprises a first major surface and a second major surface, and wherein the first electrical contact is arranged on the first major surface and comprises a conductive region, arranged on the first major surface, wherein the conductive region provides an extended contact area and is in mechanical and electrical contact with the first axial electrode section.

5. Sleeve according to claim 2, wherein the circuit board comprises an extension section, which extends, in an axial direction, further than the jacket, so that a portion of the extension section is externally accessible.

6. Sleeve according to claim 2, wherein the sleeve body comprises a second axial electrode section, which is coaxially aligned with the first axial electrode section, and which is electrically conductive or semiconductive, wherein the first axial electrode section and the second axial electrode section are separated by a first axial separation section which is electrically non-conductive.

7. Sleeve according to claim 6, wherein the circuit board comprises a first major surface and a second major surface and a second electrical contact, and wherein the first electrical contact and the second electrical contact are arranged on the first major surface, wherein the first electrical contact comprises a first conductive region providing an extended contact area, wherein the second electrical contact comprises a second conductive region providing an extended contact area, and wherein the first conductive region is in mechanical and electrical contact with the first axial electrode section, and wherein the second conductive region is in mechanical and electrical contact with the second axial electrode section.

8. Sleeve according to claim 6, wherein the sleeve body comprises a third axial electrode section, which is coaxially aligned with the first axial electrode section and the second axial electrode section, and which is electrically conductive or semiconductive, wherein the first axial electrode section and the third axial electrode section are separated by a second axial separation section which is electrically non-conductive.

9. Sleeve according to claim 8, wherein the circuit board is operable to provide an electrical contact between the second axial electrode section and the third axial electrode section.

10. Sleeve according to claim 2, wherein a first portion of the jacket is arranged on a radially outer surface of the circuit board, and wherein a second portion of the jacket is arranged on a radially outer surface of the sleeve body.

11. Sleeve according to claim 1, wherein the spacer layer is comprised in the sleeve.

12. Sleeve according to claim 1, wherein the spacer layer is comprised in the power cable, and wherein the spacer layer comprises at least a portion of an insulator layer of the power cable, the insulator layer being arranged concentrically around the inner conductor of the power cable.

13. Method of providing an expandable sleeve according to claim 2, comprising, in this sequence, the steps of:
 a) providing an expandable sleeve for a high- or medium-voltage power cable, wherein the sleeve comprises a tubular sleeve body having a first axial electrode section, which section is electrically conductive or semiconductive, wherein the sleeve is radially expandable and arrangeable radially outward of an inner conductor of the cable when expanded, such that the first axial electrode section is radially separated from the inner conductor by at least an electrically insulating spacer layer;
 providing an electrically non-conductive jacket; and
 providing a circuit board comprising opposed first and second major surfaces and a first electrical contact, arranged on the first major surface;
 b) arranging at least a part of the circuit board radially outward of the sleeve body such that the first electrical contact is electrically connected with the first axial electrode section;
 c) arranging at least a part of the jacket radially outward of the circuit board and radially outward of the sleeve body.

14. High- or medium-voltage current-carrying device for a power network, comprising an inner conductor for carrying the current, further comprising a sleeve according to claim 1, the sleeve being arranged radially outward of the inner conductor, such that the first axial electrode section is radially separated from the inner conductor by at least an electrically insulating spacer layer.

15. Electrical power distribution network, comprising a high- or medium-voltage current-carrying device for a power network according to claim 14.

16. A sleeve for a high- or medium-voltage power cable, the cable comprising an inner conductor defining axial and radial directions,
 wherein the sleeve comprises
  a tubular sleeve body having a first axial electrode section, which section is electrically conductive or semiconductive,
  wherein the sleeve is radially shrinkable into a position radially outward of the inner conductor when shrunk, such that the first axial electrode section is radially separated from the inner conductor by at least an electrically insulating spacer layer,
  and the sleeve further comprises a circuit board, at least partially arranged radially outward of the sleeve body, comprising a first electrical contact which is electrically connected with the first axial electrode section.

17. The sleeve according to claim 16, further comprising an electrically non-conductive jacket, at least partially arranged radially outward of the sleeve body, and at least partially arranged radially outward of the circuit board.

18. The sleeve according to claim 16, wherein the circuit board comprises a first major surface and a second major surface, and wherein the first electrical contact is arranged on the first major surface and comprises a conductive region, arranged on the first major surface, wherein the conductive region provides an extended contact area and is in mechanical and electrical contact with the first axial electrode section.

19. The sleeve according to claim 17, wherein the sleeve body comprises a second axial electrode section, which is coaxially aligned with the first axial electrode section, and which is electrically conductive or semiconductive, wherein the first axial electrode section and the second axial electrode section are separated by a first axial separation section which is electrically non-conductive.

20. A method of providing an expandable sleeve according to claim 17 comprising, in this sequence, the steps of:
 a) providing an expandable sleeve for a high- or medium-voltage power cable, wherein the sleeve comprises a tubular sleeve body having a first axial electrode section, which section is electrically conductive or semiconductive, wherein the sleeve is radially expandable and arrangeable radially outward of an inner conductor of the cable when expanded, such that the first axial electrode section is radially separated from the inner conductor by at least an electrically insulating spacer layer;
 providing an electrically non-conductive jacket; and
 providing a circuit board comprising opposed first and second major surfaces and a first electrical contact, arranged on the first major surface;
 b) arranging at least a part of the circuit board radially outward of the sleeve body such that the first electrical contact is electrically connected with the first axial electrode section;
 c) arranging at least a part of the jacket radially outward of the circuit board and radially outward of the sleeve body.

* * * * *

UNITED STATES PATENT AND TRADEMARK OFFICE
CERTIFICATE OF CORRECTION

PATENT NO. : 9,460,832 B2  Page 1 of 1
APPLICATION NO. : 14/765440
DATED : October 4, 2016
INVENTOR(S) : Mark Gravermann It is certified that error appears in the above-identified patent and that said Letters Patent is hereby corrected as shown below:

On the Title Page

Column 2 (Abstract)
Line 7, Delete "hat" and insert -- that --, therefor.

Signed and Sealed this
Sixth Day of June, 2017

Michelle K. Lee
*Director of the United States Patent and Trademark Office*